US006567950B1

(12) United States Patent
Bertin et al.

(10) Patent No.: US 6,567,950 B1
(45) Date of Patent: May 20, 2003

(54) DYNAMICALLY REPLACING A FAILED CHIP

(75) Inventors: Claude L. Bertin, South Burlington, VT (US); Timothy J. Dell, Colchester, VT (US); Erik L. Hedberg, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,917

(22) Filed: Apr. 30, 1999

(51) Int. Cl.[7] .............................................. G11C 29/00
(52) U.S. Cl. ...................................................... 714/767
(58) Field of Search ........................... 714/767, 7, 710, 714/762, 733, 754; 365/200–201; 716/18, 17; 712/234, 248, 11; 381/10, 13

(56) References Cited

U.S. PATENT DOCUMENTS

| 4,586,178 A | | 4/1986 | Bosse | |
|---|---|---|---|---|
| 4,754,396 A | * | 6/1988 | Horst et al. ................... | 381/10 |
| 4,908,789 A | | 3/1990 | Blokkum et al. ........... | 364/900 |
| 4,922,451 A | | 5/1990 | Lo et al. ..................... | 364/900 |
| 5,267,242 A | * | 11/1993 | Lavallee et al. ................ | 714/7 |
| 5,432,729 A | | 7/1995 | Carson et al. ................ | 365/63 |
| 5,502,645 A | * | 3/1996 | Guerra et al. ............... | 714/733 |
| 5,506,992 A | * | 4/1996 | Saxenmeyer ................. | 712/11 |
| 5,533,194 A | | 7/1996 | Albin et al. ........... | 395/183.18 |
| 5,613,077 A | | 3/1997 | Leung et al. ................ | 395/306 |
| 5,666,480 A | | 9/1997 | Leung et al. ................ | 395/180 |
| 5,758,056 A | * | 5/1998 | Barr .............................. | 714/7 |
| 6,018,817 A | * | 1/2000 | Chen et al. .................. | 714/762 |

OTHER PUBLICATIONS

NN73033052(Dynamic Configuration; IBM Technical Disclosure Bulletin, Mar. 1973, US, vol. No.: 15, p. No.: 3052–3055).*
NN82024776(Dynamic Allocation of Redundant Memory Components; IBM Technical Disclosure Bulletin, Feb. 1982, US; vol. No.: 24, p. No.: 4776–4778).*
NN890314(Intermittent Memory Failure Detection and Reconfiguration; IBM Technical Disclosure Bulletin, Mar. 1989, US; vol. No.: 3, p. No.: 141–142).*
"Memory Error Correction Technique", IBM Technical Disclosure Bulletin, vol. 28, No. 2, Jul., 1985.

* cited by examiner

Primary Examiner—Albert Decady
Assistant Examiner—Guy Lamarre
(74) Attorney, Agent, or Firm—William N. Hogg

(57) ABSTRACT

An improved chip sparing system and method of operation are provided in which a failed chip is detected even if there are multiple errors on a single chip and one or more spare chips are provided within the system; and in which spare chips or space chip I/Os are dynamically inserted into the system upon detection of a failed chip or chip I/O without the necessity of shutting down and rebooting the system or even without the necessity of re-initializing the memory.

16 Claims, 4 Drawing Sheets

DYNAMICALLY REPLACING A FAILED CHIP

FIELD OF THE INVENTION

This invention relates to computer systems having a DRAM memory and, more particularly, to computer systems having DRAM memories, wherein failed chips or chip sets or chip I/O can be replaced with good chips or chip sets OR I/O without having to replace the entire memory or reboot.

BACKGROUND INFORMATION

The amount of memory on a DIMM or SIMM card utilized in a computer system increases, and the number of chips which constitute or make-up the memory card also increases. With the increasing number of DRAM chips on a DIMM or SIMM card, there is an increased potential or possibility of failure of one or more of these chips. In order to obviate the need for discarding an entire memory card if a single chip fails, there have been proposals for so called "Chip Sparing" in which one or more "spare" chips are provided on the SIMM or DIMM card, i.e. a chip that is not normally used for data storage. When a chip fails, this "spare" chip is then inserted into the system in place of the failed chip, sometimes referred to as chip kill, and the memory is allowed to continue. In the past, this chip replacement has been accomplished by completely shutting the system down and replacing the memory system with the spare chip switched into the memory system in place of the failed chip, which insertion has been done with the system powered down and the system then rebooted; or, in the alternative, with some more sophisticated systems, the memory card is switched off-line and reinitialized with the spare chip. The rebooting of the system or re-initialization of the memory card is time consuming and disruptive of continuous operation of a computer system.

SUMMARY OF THE INVENTION

According to the present invention, an improved chip sparing system and method of operation are provided in which a failed chip is detected even if there are multiple errors on a single chip and one or more spare chips are provided within the system; and in which spare chips or spare chip I/Os are dynamically inserted into the system upon detection of a failed chip or chip I/O without the necessity of shutting down and rebooting the system or even without the necessity of re-initializing the memory.

DESCRIPTION OF THE PREFERRED EMBODIMENT(S)

Figure 1:
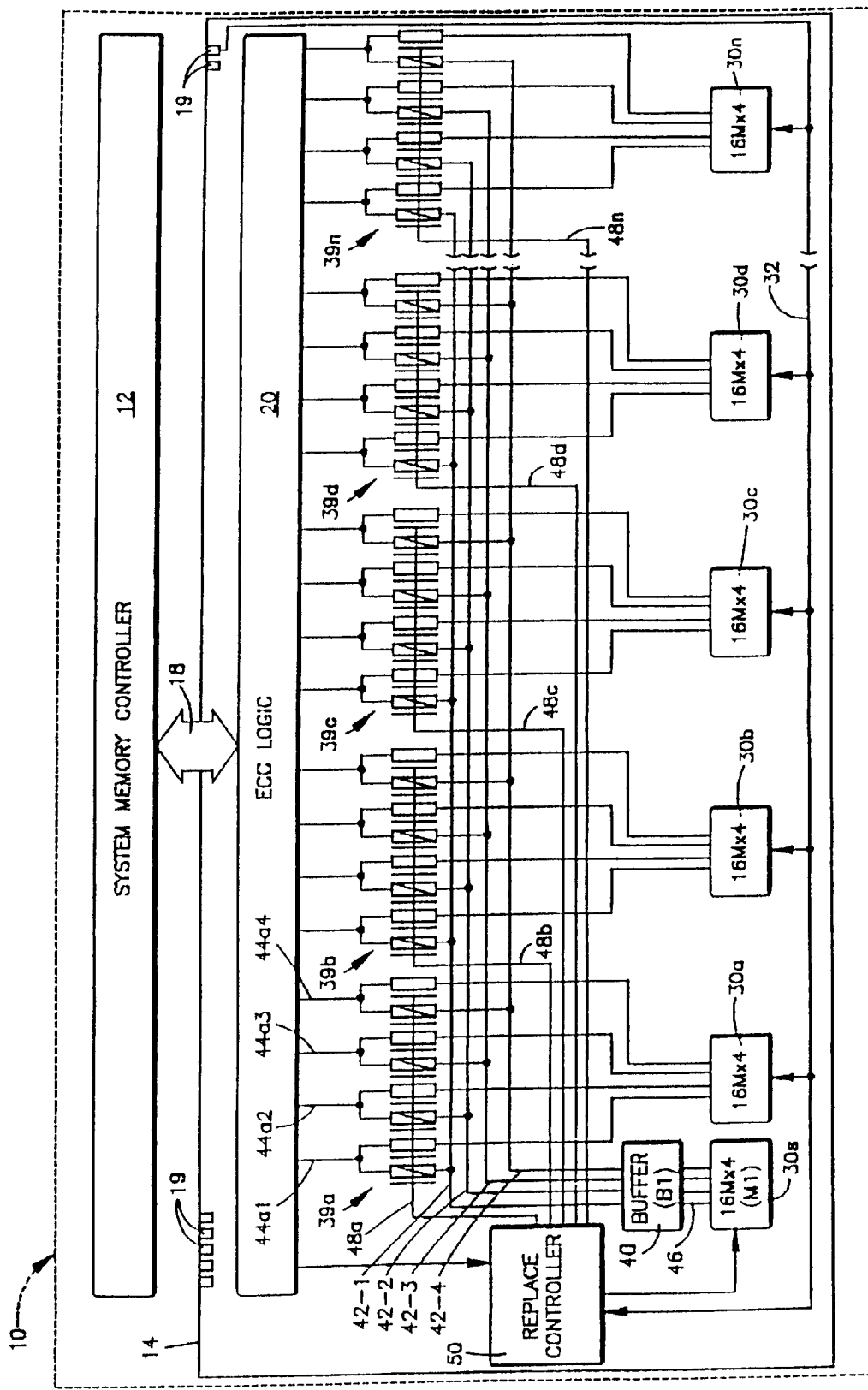
FIG. 1 is a high level diagram of a computer system having a DIMM card on which there is a chip sparing system according to this invention.

Referring now to the drawings, and for the present to FIG. 1, a portion of a memory card in the form of a dual in-line memory module (DIMM) is shown incorporating the present invention as used in a computer system designated generally as 10. The computer system 10 includes a CPU (not shown) and a system memory controller 12. A portion of a DIMM 14 is shown as it is plugged into communication with the system memory controller 12. Memory bus 18 communicates with contacts or pins 19, some of which are shown diagrammatically on the DIMM 14. The DIMM has thereon error correction code (ECC) logic 20. The nature and operation of the ECC logic 20 will be described presently.

There are a plurality of DRAM chips 30 on the DIMM 14, some of which are shown and designated as 30a, 30b, 30c, 30d . . . 30n and 30s. The chips 30a, 30b, 30c, 30d . . . 30n are operating chips, only a few of which are shown, it being understood that typically a DIMM would have a memory configuration of enough chips to provide a data bus 72 bits wide. DRAM 30s is a spare chip, which is not used during normal operating conditions, and is used according to this invention when there is chip fail or an I/O fail. Only one spare chip 30s is shown; however, additional spare chips 30s could be provided, the number of additional chips 30s being dependent upon the particular configuration of DRAM chips 30, and the error correction required and the configuration of the boundaries being corrected, e.g., a chip or an I/O.

As will be described presently, in the illustrated embodiments, the DRAM chips are 16 m×4 synchronous DRAMs (SDRAMs) and, in such a case, the error correction for the present invention requires 12 check bits which in this configuration requires 3 additional DRAM chips to store the check bits. However, 16 m×8 chips could be used, and in such case to accomplish the purpose of the present invention, 16 bit error correction code is required which would necessitate the use of 2 additional 16 m×8 DRAM chips to accommodate the 16 check bits.

Figure 1A:
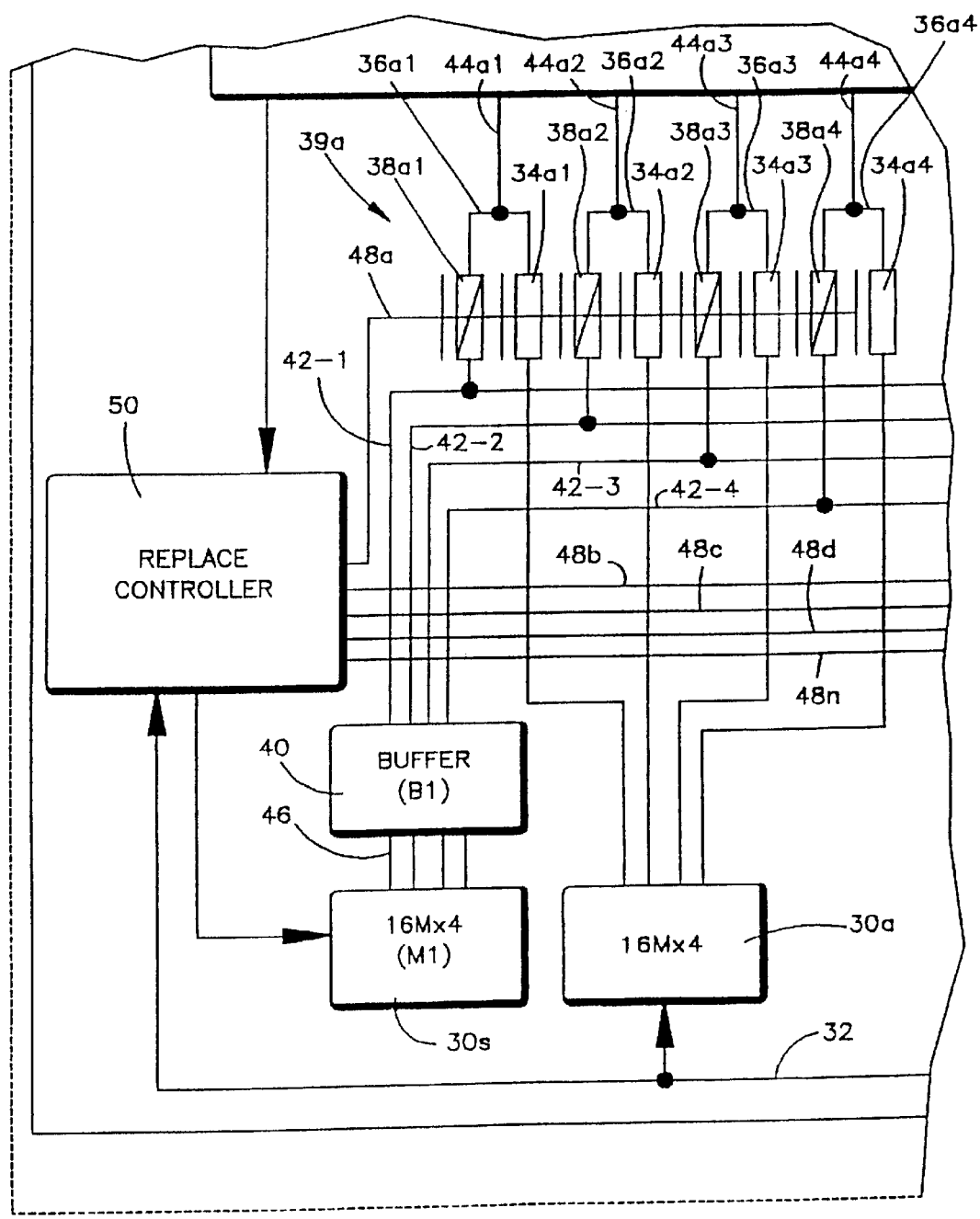
FIG. 1a is a view of a portion of the DIMM of FIG. 1 on an enlarged scale.
Figure 2:
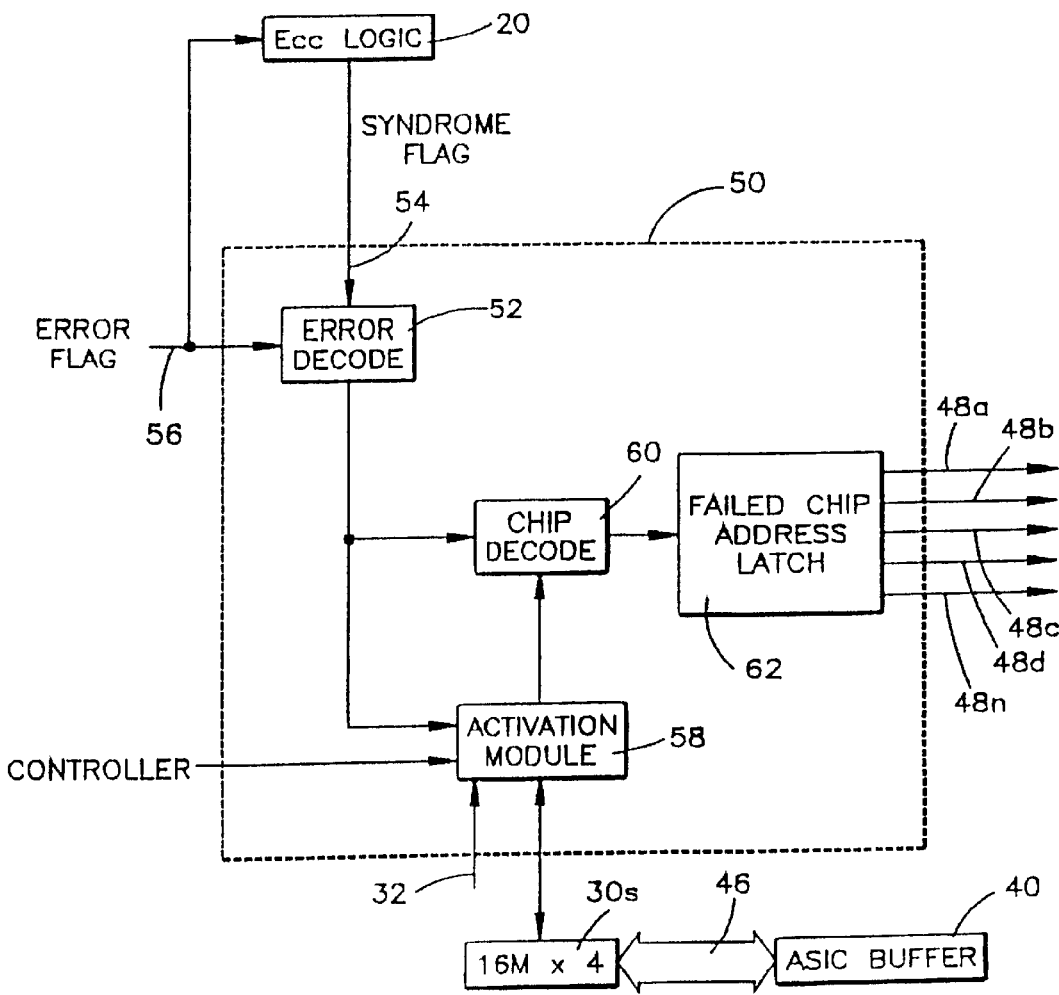
FIG. 2 is a block diagram of the chip replace control.

In the present and disclosed embodiment of FIGS. 1, 1a and 2, a chip select line 32 is provided which extends from the memory controller 12 through one of the pins 19 to each of the chips 30a–30n. The connection of the chip or chips 30s (the spare chip or chips) will be described presently.

As can be seen in FIGS. 1 and 1a, each of the chips 30a–30n is connected to PFETs 34a1, 34a2, 34a3, 34a4; 34b1, 34b2, 34b3, and 34b4 . . . 34n1, 34n2, 34n3, and 34n4 through PFET traces 36a1, 36a2, 36a3, 36a4; 36b1, 36b2, 36b3, 36b4; . . . 36n1, 36n2, 36n3 and 36n4. There are also a plurality of NFETs 38a1, 38a2, 38a3, 38a4; 38b1, 38b2, 38b3, 38b4; . . . 38n1, 38n2, 38n3, 38n4, one corresponding to each PFET 36a–n, connected in parallel with their corresponding PFETs 34a–n. The NFETs 34a1–34a4 and PFETS 38a1–38a4 and their connections are referred to collectively generally as 39a. The other NFETs and PFETs and their connections are referred to generally as 39b, 39c, 39d, . . . 39n. The NFETs 38 are connected to buffer 40 through NFET traces 42. In the embodiment shown in FIG. 1, each of the NFETs 38a1, 38b1, 38c1, 38d1, . . . 38n1 is connected to NFET trace 42-1. Each of the NFETs 38a2, 38b2, 38c2, 38d2, . . . 38n2 is connected to NFET trace 42-2; each of the NFETs 38a3, 38b3, 38c3, 38d3 . . . 38n3 is connected to NFET trace 42-3; and each of the NFETs 38a4, 38b4, 38c4, 38d4 . . . 38n4 is connected to NFET trace 42-4.

The outputs of the FETs 38a1 and 34a1 are tied together as a single output on FET output trace 44a1. The outputs of FETs 34a2 and 38a2 are connected together on FET output trace 44a2, outputs of FETs 34a3 and 38b3 are connected together as FET output on output trace 44a3, and the outputs of FETs 38a4 and 34a4 are connected together as FET output on output trace 44a4, all of which traces 44 connect to the ECC logic 20. The other PFETs and NFETs are similarly connected together in groups of 8 FETs providing 4 outputs.

The gates of the transistors 34a1, 38a1, 34a2, 38a2, 34a3, 38a3 and 34a4 and 38a4 are connected to gate trace 48a; the gates of transistors 34b1, 38b1, 34b2, 38b2, 34b2, 38b3, and 34b4 and 38b4 are connected to gate trace 48b; the gates of the remaining transistors are similarly connected to gate traces 48c, 48d... 48n. Traces 48a, 48b, 48c, 48d... 48n are connected to a chip replace controller 50.

The structure of the chip replace controller 50 is shown in FIG. 2. As can be seen in FIG. 2, the chip replace controller includes error decode logic 52, configured to receive a syndrome flag 54 from the ECC logic 20 and also an error flag 56 also from the ECC logic 20. The chip replace controller 50 also includes activation module logic circuitry 58, a chip decode logic circuit 60 and a failed chip address latch 62. The various buses and lines connecting to the chip replace controller 50 and, internally of the chip, replace controller 50 are shown in FIG. 2.

Before describing the operation of the system as a replacement for detected chip errors, a brief overview of the operation generally of the error correction code function will be given. Error correction code operates with logic circuitry generating check bits from data words or other bits written to memory storage and the generated check bits are stored together with the bits of the data words in the memory storage. When the data words are read from memory storage, the check bits associated with that data word are also read; and also a new set of check bits is generated from the read data bits.

In the present invention, the computer system 10 may have ECC native thereto and, thus, a 72 bit bus will carry 64 data bits and 8 check bits. However, the ECC of this system will treat all 72 bits as data bits and generate its own check bits based on the 72 bits received. Hence, as used herein, the term check bits refers to the check bits generated on the DIMM card by the ECC 20 using all 72 bits from the memory controller 12 which are treated as, and referred to as, data bits.

During the read cycle, the newly generated check bits are compared with the stored check bits generated by the ECC, which comparison generates what are known as syndrome bits. A particular pattern of syndrome bits will indicate which bit or bits if any have been changed during storage and, to the extent of the robustness of the error correction code, the errors of one or more bits are corrected on the read out of the data bits. Some error correction codes detect and correct all one bit errors and detect certain multiple bit errors and, in some cases, are able to correct some multiple bit errors.

The error correction code used in the present application is of the type that any single bit error occurring in any chip can be detected and corrected, and all multiple bit errors occurring within a given chip in one embodiment, or within an I/O boundary in another embodiment, can be detected and corrected. Thus, if a single bit error occurs anywhere, it will be detected and corrected, and if a multiple bit error occurs on any given chip up to the number of bits of storage of the chip, or on an I/O boundary, this error can also be corrected.

A particularly useful ECC for the present invention is that which is disclosed in application Ser. No. 08/984,240, now U.S. Pat. No. 6,018,817, filed Dec. 3, 1997, entitled "Error Correcting Code Retrofit Method and Apparatus for Multiple Memory Configurations", which is incorporated herein by reference as if it were set out in its entirety.

In the present embodiment, the error correction code in one form is able to correct all of the errors on a 4 bit wide chip and, in another embodiment, is able to correct all multiple bit errors in a given 8 bit wide chip. The number of check bits required to correct all single bit errors on any chip and all the bit errors on a 4 bit wide chip requires the generation of 12 check bits and, for the correction of all single bit errors and all multiple errors on an 8 bit wide chip, the error correction code requires the generation of 16 check bits. This will hereinafter be referred to as the "Chen ECC" and, when necessary, denoted with the 4 bit wide chip correction code or 8 bit wide chip correction code. Also, it is to be noted that if two 4 bit wide chips are wired together in some manner to operate as an 8 bit chip, for the purpose of this application, this constitutes an 8 bit wide chip or chip set and requires a 16 bit Chen ECC.

Turning now to FIGS. 1 and 2 of the drawings, during a normal operation of the DIMM 14 and during a write cycle from the memory controller 12 which, in the disclosed embodiment writes to a 72 bit bus on the DIMM 14, the DRAMs 30a, 30b, 30c, 30d... 30n, (but not DRAM or DRAMs 30s) are the operative chips to receive both the 72 data bits written by the system memory controller 12 and the check bits generated by the ECC logic 20. The ECC logic, as indicated above, is Chen ECC logic and has the ability to detect and correct any single bit error in any chip and to detect multiple bit errors, including up to 4 bit errors in any one chip. During normal operation, the Chen ECC logic operates to write the generated check bits upon writing data on a write cycle, and upon reading the data on a read cycle, generate a new set of check bits, and compare the newly generated check bits with the stored check bits, as described in application Ser. No. 08/984,240, now U.S. Pat. No. 6,018,817. As long as the newly generated ECC check bits are the same as the stored check bits, the syndrome bits indicate that no error has occurred and no correction of the data bits is performed. However, if, in comparing the newly generated check bits with the stored check bits, a syndrome is generated which indicates an error in any one bit, this bit is corrected by "flipping" the bit (on the read cycle) and the error decode 52 indicates to the activation module 58 that such an "error event" has occurred, and in which bit. The detected "error events" are accumulated and stored in a counter/register through a counter to indicate how many times an error has occurred in a particular bit. Moreover, if a multiple bit error is detected and corrected in a given chip, this will also be flagged to the activation module and the number of errors occurring on any of these particular bit patterns will be stored. After a given number of single bit errors has occurred on a given chip, e.g. a common number is 512 errors, or after a given number of multiple bit errors on a single chip have been detected and corrected, e.g. 512 errors, the activation module 58 will generate a signal to the chip decode 60 which will generate a signal to the failed chip address latch 62, which will actuate the appropriate gate through traces 48 corresponding to the FETs associated with the failed chip. The actuation of the gates through traces 48 associated with the failed chip will turn "off" the PFETs 34 and turn "on" the NFETs 38 associated therewith, thus resulting in a chip kill for that particular DRAM. For example, if the failed chip is 30a, PFET 34a1 will be turned off and NFET-38a1 will be turned on, PFET 34a2 will be turned off and NFET 38a2 will be turned on, PFET 34a3 will be turned off and NFET 38a3 will be turned on, and PFET 34a4 will be turned off and NFET 38a4 will be turned on through gate electrodes of PFETs 34a and NFETs 38a. This will also activate the DRAM 30s, thus connecting it in place of the DRAM 30a through buffer 40 to the lines 44-1, 44-2, 44-3, and 44-4. The turning off of the PFETs 34 and turning on of the NFETs 38 and the activation through the buffer 40 will thus insert the spare DRAM chip 30s into the system replacing failed DRAM chip 30a which has been "killed", i.e. deactivated. The chip select through the activation module 58 of the chip replace controller 50 will steer the chip select signals intended for the DRAM 30a to the DRAM 30s. It will be noted that the chip select signals will still be delivered to the DRAM 30a, however, since the PFETs 34a1–34a4 associated with DRAM 30a have been turned off, they will not be supplying the data bits to or receiving the data bits from the lines 44-1, 44-2, 44-3, and 44-4; rather, these data bits will be supplied by or to the DRAM 30s which has been activated.

At this point, it should be noted that the data initially in the DRAM 30s will not be the correct data which was stored in the replaced DRAM chip, i.e. in this case, DRAM chip 30a. However, this does not matter, since the error correction code logic is the Chen ECC logic and can correct all multiple bit errors occurring in a given chip. Thus, when the data is read from the chip 30s, the data will, of course, be wrong initially but the error correction code logic 30 will correct this data upon reading it, and the correct data will be restored together with the correct check bits on a write cycle. Thus, each time the data is read from the DRAM 30s and replaced therein, it is stored as corrected, or if new data is written, the correct data is written with the correct check bits generated. Thus, over a period of time, the replaced DRAM 30s will contain the correct data. Hence, it is not, necessary to shut the system down or to reboot or to reinitialize the memory card after chip substitution. Since error correction is performed on successive reads of the data stored, this will actually provide the correct data to the spare DRAM 30s.

It should be understood that more than one spare chip could be provided and the necessary logic also provided so that when one spare chip has replaced one of the DRAMs 30a–30n and another chip fails, then a second spare DRAM 30s can be utilized to replace the second failed chip 30a–30n. Thus, several additional spare DRAMs can be used to produce ultra-reliable memory units.

Experience and reliability testing determine the proper number of spares to be utilized. It should also be realized that when all of the spare DRAMs have been used, and multiple errors or single bit errors are continuing beyond the normally expected number, a flag of some type can be generated to the user to indicate that errors which normally trigger chip replacement are occurring and there are no chip replacement DRAM chips left, so that appropriate remedial action can be taken by the user if deemed necessary.

It should also be noted that, as with other ECC's, the Chen ECC is capable of correcting errors occurring in check bits including multiple chip errors if the bad check bits are all stored on a single chip or if a single bit check bit error is repeated sufficiently to cause a chip kill function to be indicated.

Figure 3:
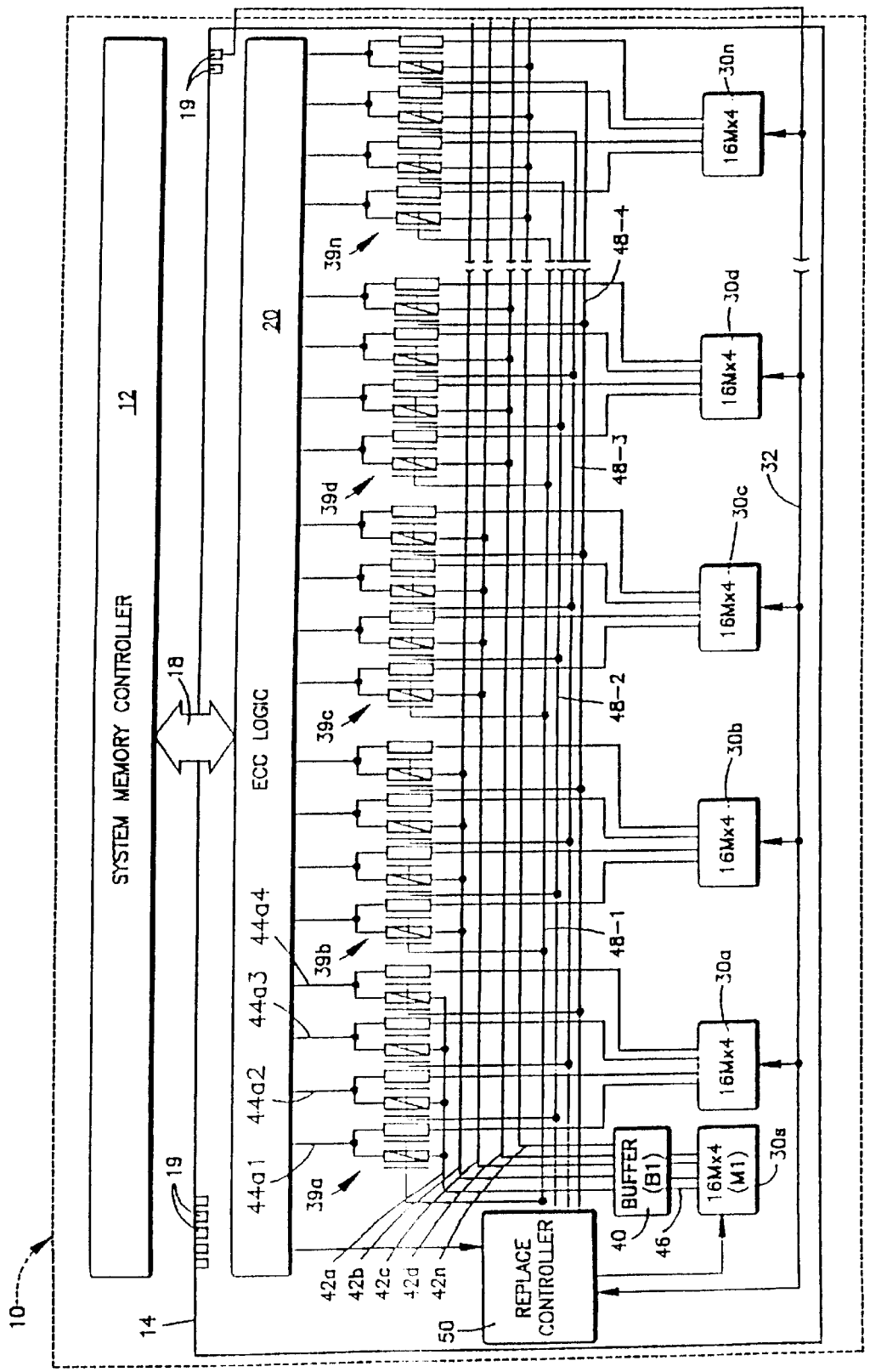
FIG. 3 is a diagram similar to FIG. 1 configured to replace I/O rather than a failed chip.

Referring now to FIG. 3, a similar scheme utilizing the Chen ECC can be used to replace the I/O failures on a single chip rather than as a full chip replace. In this case, all of the gates of the FETs 34a1, 38a1, 34b1, 38b1, 34c1, 38c1, 34d1, and 38d1 are connected together by circuit trace 48-1; the gates of FETs 34a2, 38a2, 34b2, 38b2, 34c2, 38c2, 34d2, and 38d2 are connected together by circuit trace 48-2; the gates of FETs 34a3, 38a3, 34b3, 38b3, 34c3, 38c3, 34d3 and 38d3 are connected together by circuit trace 48-3; and the gates of FETs 34a4, 38a4, 34b4, 38b4, 34c4, 38c4, 34d4 and 38d4 are connected together by circuit trace 48-4. The FETs 38a1, 38a2, 38a3 and 38a4 are connected to circuit trace 42a; FETs 38b1, 38b2, 38b3 and 38b4 are connected to circuit trace 42b; FETs 38c1, 38c2, 38c3 and 38c4 are connected to circuit trace 42c; and FETs 38d1, 38d2, 38d3 and 38d4 are connected to circuit trace 42. In this embodiment, failures at a single I/O of any chip can be replaced without the necessity of replacing the entire chip. Thus, if data from the first I/O pad of DRAM 30a becomes a failure, but data from the other pads continues to be satisfactory, then only the first I/O of the bad chip is replaced with the first I/O of spare chip 30s. Hence, if the data at another I/O of a different chip, e.g. the second I/O of chip 30b goes bad, then the second I/O of spare chip 30s can be used to replace the data corresponding to the second I/O of chip 30b, etc. In this way, single I/O failures can be dealt with on an individual basis without the necessity of replacing the entire chip due to a single I/O failure. It should be noted that in this embodiment the number of I/O failures that can be replaced is limited to the number of I/Os on the spare chip 30s. Thus, if it is an ×4 chip, then the number of I/Os that can be replaced is 4.

Accordingly, the preferred embodiment of a SIMM and system for utilizing a SIMM having a 16 m×8 DRAM thereon has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What we claim is:

1. A method of replacing one of a plurality of operating DRAM chips in a memory circuit or a given I/O failure of DRAM chips with a spare DRAM chip on a memory module, in which a plurality of operating DRAM chips constitutes a multiple byte word, and which memory module includes error correction code (ECC) for detecting and correcting all single bit errors and detecting and correcting all multi bit errors in a single DRAM chip, and which ECC includes detecting and flagging in which chip any error occurs, said method comprising the steps of;

providing at least one spare DRAM chip, said ECC setting a flag to identify a chip having a first preselected error profile, and entering a chip kill or I/O kill mode upon generation of said flag to deactivate the chip or an I/O on said chip that caused said flag, activating said spare chip or the I/O on said spare chip corresponding to the chip or I/O deactivated; and thereafter operating said ECC in the normal operating mode without interruption of operation on all of the chips except the deactivated chip or I/O deactivated and on the activated chip or activated I/O.

2. The method of claim 1 wherein all of said chips are connected in said memory circuit through switches having "on" and "off" functions, and said deactivation of the chip or I/O that caused said flag and the activation of the spare chip or I/O on the spare chip includes switching the portion of said switch connecting said chip or I/O failure that caused said flag to the "off" position and the switch of the spare chip or corresponding I/O to the "on" position.

3. The method as defined in claim 2 wherein said switches includes FETs.

4. The method as defined in claim 3 wherein said FETs include NFETs and PFETs connected in parallel with ECC logic.

5. The method as defined in claim 1 wherein a second flag is set when a given number of chip or I/O failures has occurred after said spare chip or I/O on a spare chip has been activated.

6. The method as defined in claim 1 wherein a single I/O on any chip is replaced by a single I/O of the spare chip.

7. The method as defined in claim 1 wherein an entire chip is replaced by a spare chip.

8. A memory module that replaces one of a plurality of operating DRAM chips in a memory circuit or a given I/O failure of DRAM chips with a space DRAM chip on said memory module, in which a plurality of operating DRAM chips constitutes a multiple byte word, comprising:

error correction code (ECC) for detecting and correcting all single bit errors and detecting and correcting all multi bit errors in a single DRAM chip, and which ECC includes circuitry for detecting and flagging in which chip any error occurs, at least one spare DRAM chip;

circuitry for setting a flag to identify a chip having a first preselected error profile, and entering a chip kill or I/O kill mode upon generation of said flag to deactivate the chip or an I/O on said chip that caused said flag, circuitry for activating said spare chip or the I/O on said spare chip corresponding to the chip or I/O deactivated; and circuitry for operating said ECC in the normal operating mode without interruption of operation on all of the chips except the deactivated chip or I/O deactivated and on the activated chip or activated I/O when said spare chip as I/O on said spare chip is activated.

9. The memory module of claim 8 wherein all of said chips are connected in said memory circuit through switches having "on" and "off" functions, and said deactivation of the chip or I/O that caused said flag and the activation of the spare chip or I/O on the spare chip includes circuitry to switch the portion of said switch connecting said chip or I/O failure that caused said flag to the off position and the switch of the spare chip or corresponding I/O to the "on" position.

10. The memory module as defined in claim 9 wherein said switches include FETs.

11. The memory module as defined in claim 10 wherein said FETs include NFETs and PFETs connected in parallel with ECC logic.

12. The memory module as defined in claim 8 including circuitry to set a second flag when a given number of chip or I/O failures has occurred after said spare chip or I/O on a spare chip has been activated.

13. The memory module as defined in claim 8 wherein a single I/O on any chip is replaced by a single I/O of the spare chip.

14. The memory module as defined in claim 8 wherein an entire chip is replaced by a spare chip.

15. In combination, a computer being a CPU, at least one memory module that replaces one of a plurality of operating DRAM chips in a memory circuit or a given I/O failure of DRAM chips with a space DRAM chip on said memory module, in which a plurality of operating DRAM chips constitutes a multiple byte word, comprising:

error correction code (ECC) for detecting and correcting all single bit errors and detecting and correcting all multi bit errors in a single DRAM chip, and which ECC includes circuitry for detecting and flagging in which chip any error occurs, at least one spare DRAM chip;

circuitry for setting a flag to identify a chip having a first preselected error profile, and entering a chip kill or I/O kill mode upon generation of said flag to deactivate the chip or an I/O on said chip that caused said flag, circuitry for activating said spare chip or the I/O on said spare chip corresponding to the chip or I/O deactivated; and circuitry for operating said ECC in the normal operating mode without interruption of operation on all of the chips except the deactivated chip or I/O deactivated and on the activated chip or activated I/O when said spare chip as I/O on said spare chip is activated.

16. The combination of claim 15 wherein all of said chips on each memory module are connected in said memory circuit through switches having "on" and "off" functions, and said deactivation of the chip or I/O that caused said flag and the activation of the spare chip or I/O on the spare chip includes circuitry to switch the portion of said switch connecting said chip or I/O failure that caused said flag to the "off" position and the switch of the spare chip or corresponding I/O to the "on" position.

\* \* \* \* \*